(12) United States Patent
Kobayashi et al.

(10) Patent No.: US 9,231,195 B2
(45) Date of Patent: Jan. 5, 2016

(54) MAGNETIC MEMORY AND METHOD OF MANUFACTURING THE SAME

(71) Applicant: KABUSHIKI KAISHA TOSHIBA, Tokyo (JP)

(72) Inventors: Shinya Kobayashi, Yokohama (JP); Kenji Noma, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 302 days.

(21) Appl. No.: 14/019,894

(22) Filed: Sep. 6, 2013

(65) Prior Publication Data
US 2014/0203385 A1  Jul. 24, 2014

(30) Foreign Application Priority Data
Jan. 24, 2013  (JP) .................. 2013-011225

(51) Int. Cl.
| G11C 11/00 | (2006.01) |
| H01L 43/10 | (2006.01) |
| H01L 43/12 | (2006.01) |
| H01L 43/08 | (2006.01) |
| H01L 27/22 | (2006.01) |

(52) U.S. Cl.
CPC ............ H01L 43/10 (2013.01); H01L 43/08 (2013.01); H01L 43/12 (2013.01); H01L 27/228 (2013.01)

(58) Field of Classification Search
CPC ....................................................... G11C 11/00
USPC ......... 365/48, 55, 62, 66, 74, 78, 80–93, 100, 365/129, 130, 131, 148, 158, 171–173, 209, 365/213, 225.5, 230.07, 232, 243.5; 257/295, 421, 422, 427, E21.665, 257/E27.006; 438/3; 977/933–935
See application file for complete search history.

(56) References Cited

U.S. PATENT DOCUMENTS

| | | | |
|---|---|---|---|
| 2005/0036361 A1 | 2/2005 | Fukuzumi | |
| 2005/0254288 A1 | 11/2005 | Fukuzumi | |
| 2006/0118842 A1 | 6/2006 | Iwata | |
| 2007/0030724 A1* | 2/2007 | Hosomi | G11C 11/16 365/158 |
| 2010/0080050 A1* | 4/2010 | Ozeki | B82Y 25/00 365/158 |
| 2010/0097846 A1* | 4/2010 | Sugiura | G11C 11/16 365/158 |
| 2010/0214826 A1* | 8/2010 | Fukami | B82Y 10/00 365/158 |
| 2010/0246244 A1* | 9/2010 | Shimomura | G11C 11/16 365/158 |
| 2010/0277971 A1* | 11/2010 | Slaughter | G11C 11/16 365/158 |
| 2011/0063899 A1* | 3/2011 | Ogimoto | G11C 11/16 365/158 |
| 2011/0292714 A1* | 12/2011 | Andre | G11C 11/16 365/148 |
| 2012/0069642 A1* | 3/2012 | Ueda | G11C 11/16 365/158 |
| 2012/0075922 A1 | 3/2012 | Yamada et al. | |
| 2012/0081950 A1* | 4/2012 | Slaughter | H01L 27/228 365/158 |
| 2012/0163070 A1* | 6/2012 | Nagase | B82Y 25/00 365/158 |

* cited by examiner

*Primary Examiner* — Harry W Byrne
(74) *Attorney, Agent, or Firm* — Holtz, Holtz, Goodman & Chick PC

(57) ABSTRACT

According to one embodiment, a magnetic memory comprises an electrode, a memory layer which is formed on the electrode and has magnetic anisotropy perpendicular to a film plane, and in which a magnetization direction is variable, a tunnel barrier layer formed on the memory layer, and a reference layer which is formed on the tunnel barrier layer and has magnetic anisotropy perpendicular to the film plane, and in which a magnetization direction is invariable. The memory layer has a positive magnetostriction constant on a side of the electrode, and a negative magnetostriction constant on a side of the tunnel barrier layer.

18 Claims, 14 Drawing Sheets

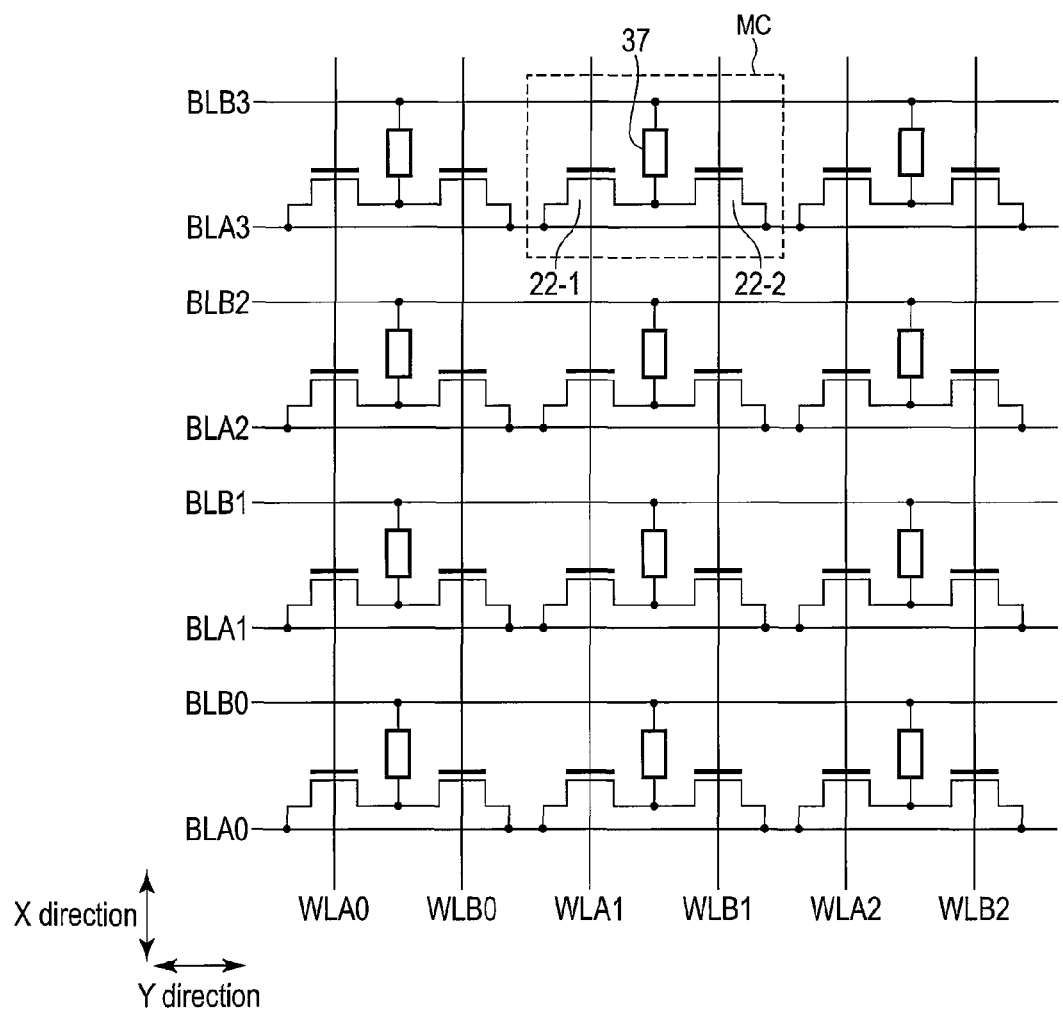
F I G. 1

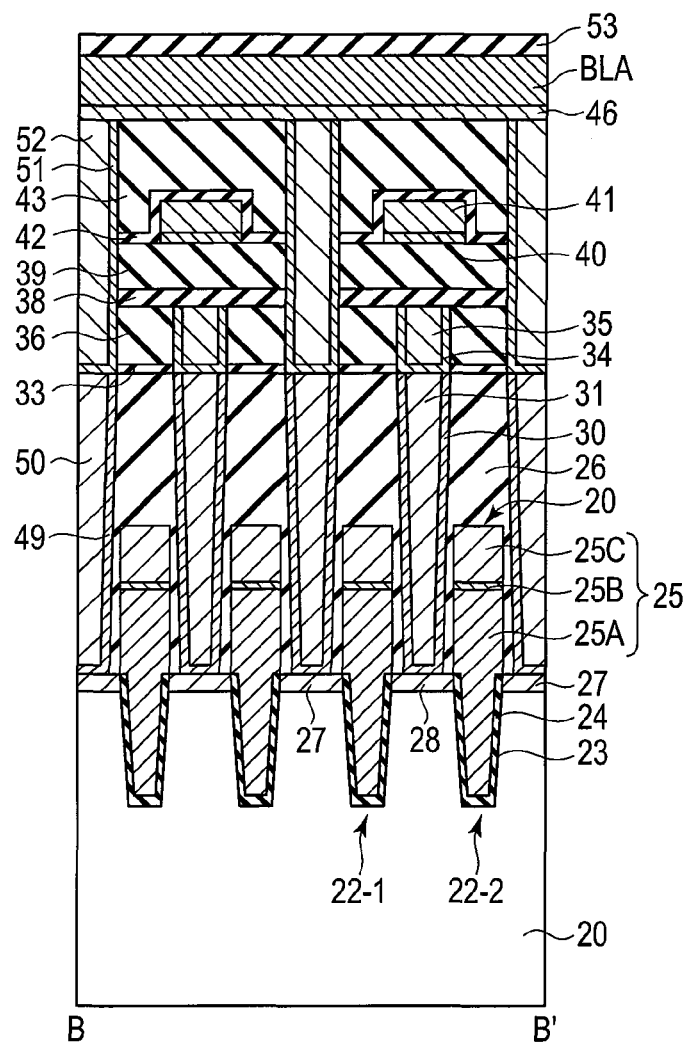
F I G. 4

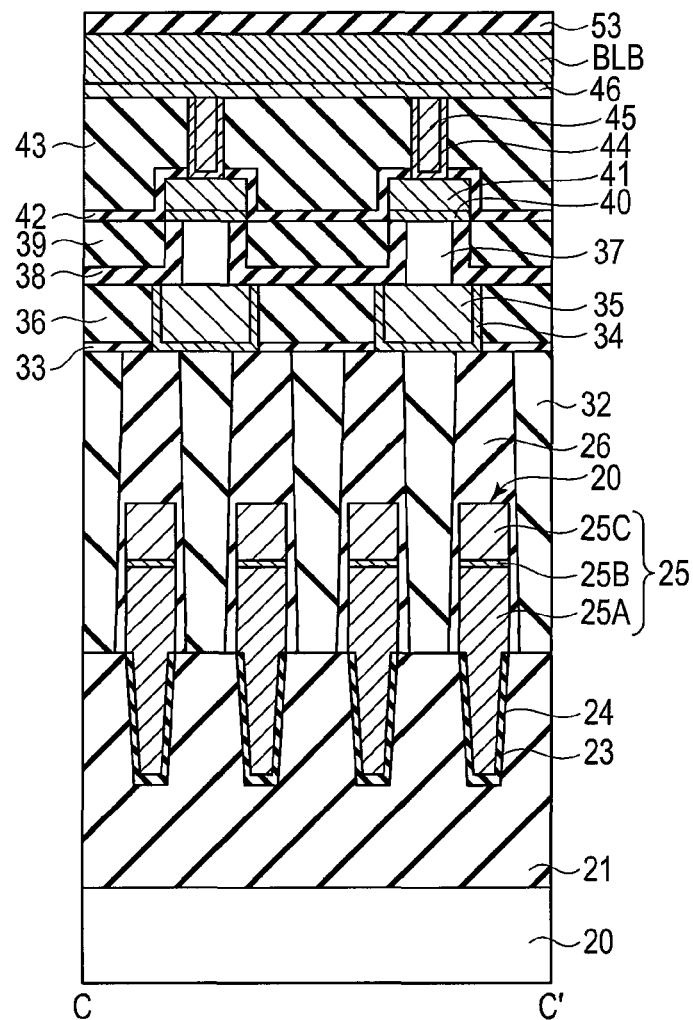
F I G. 5

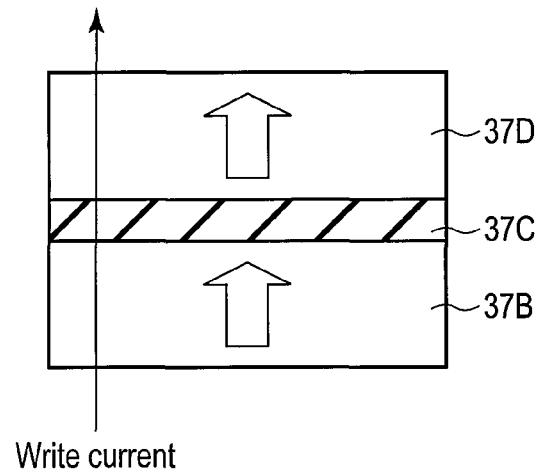
Write current
Parallel state (low resistance)
F I G. 7A
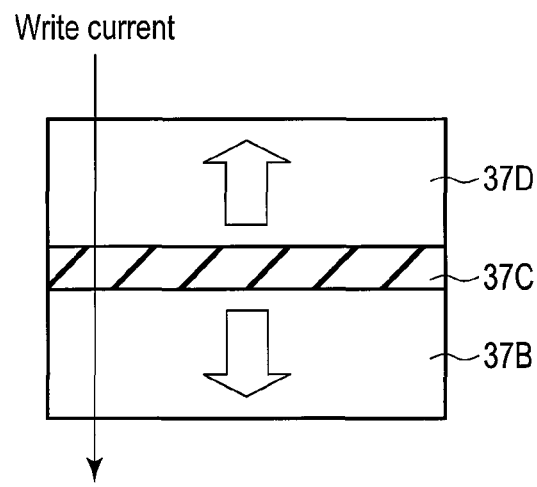
Anti-parallel state (high resistance)
F I G. 7B

| Material | Thermal expansion coefficient ($\times 10^{-6}$/K) |
|---|---|
| Fe | 12~13 |
| Co | 12~14 |
| Ni | 13 |
| Ta | 6.5 |
| W | 4.5~4.6 |

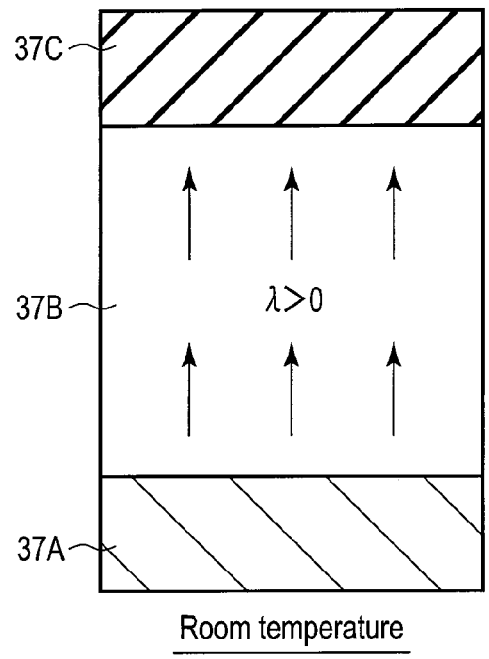
F I G. 11A
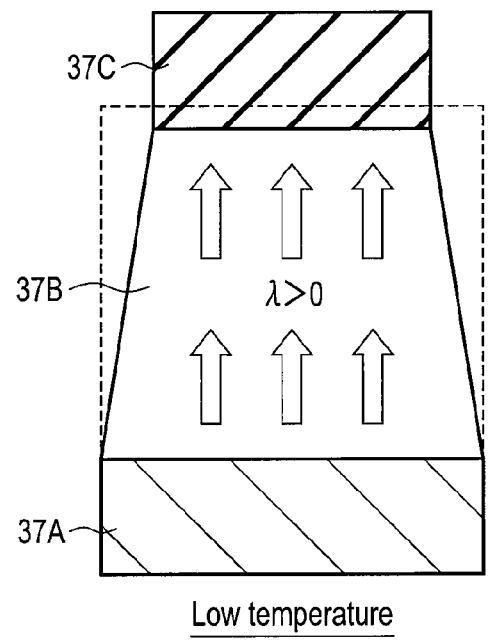
F I G. 11B

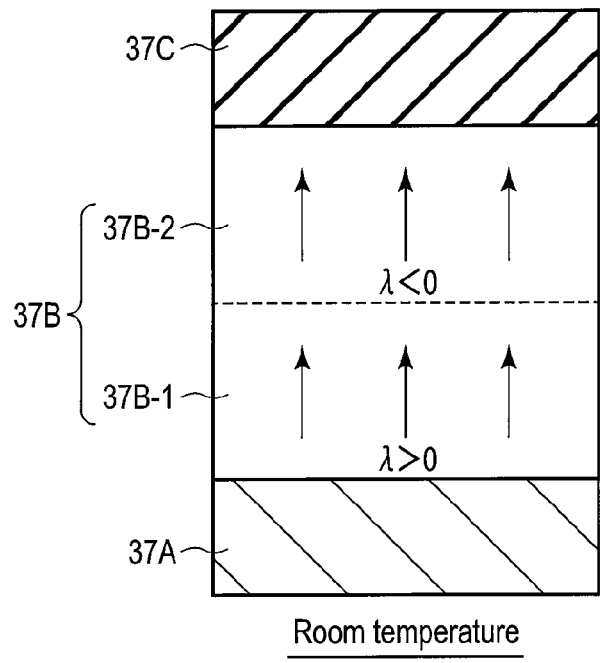
F I G. 12A
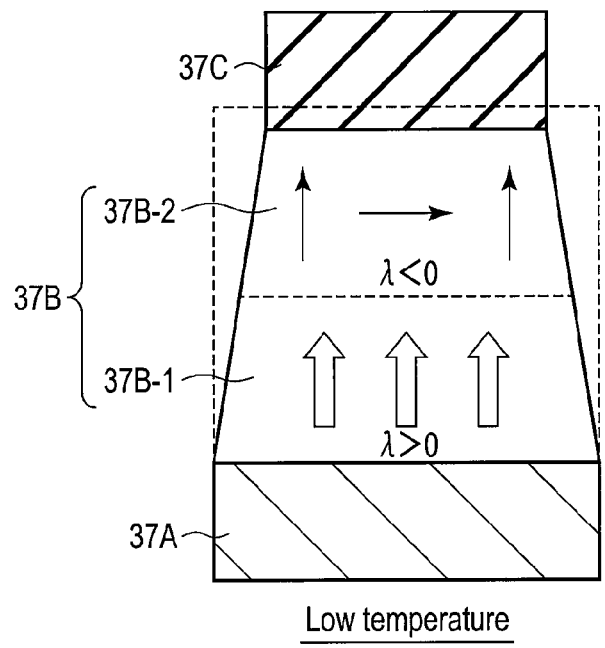
F I G. 12B

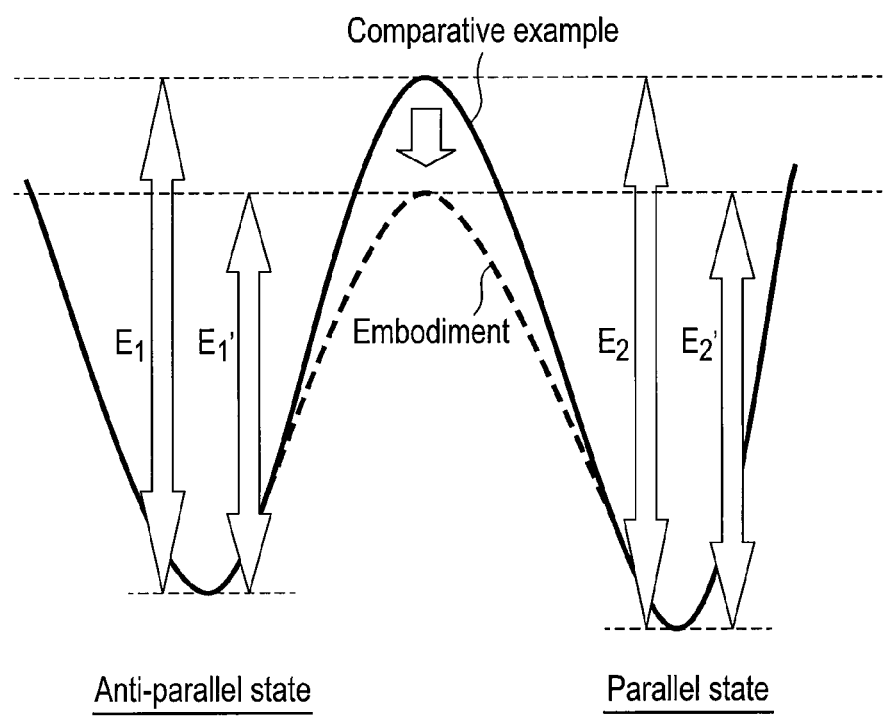
F I G. 13

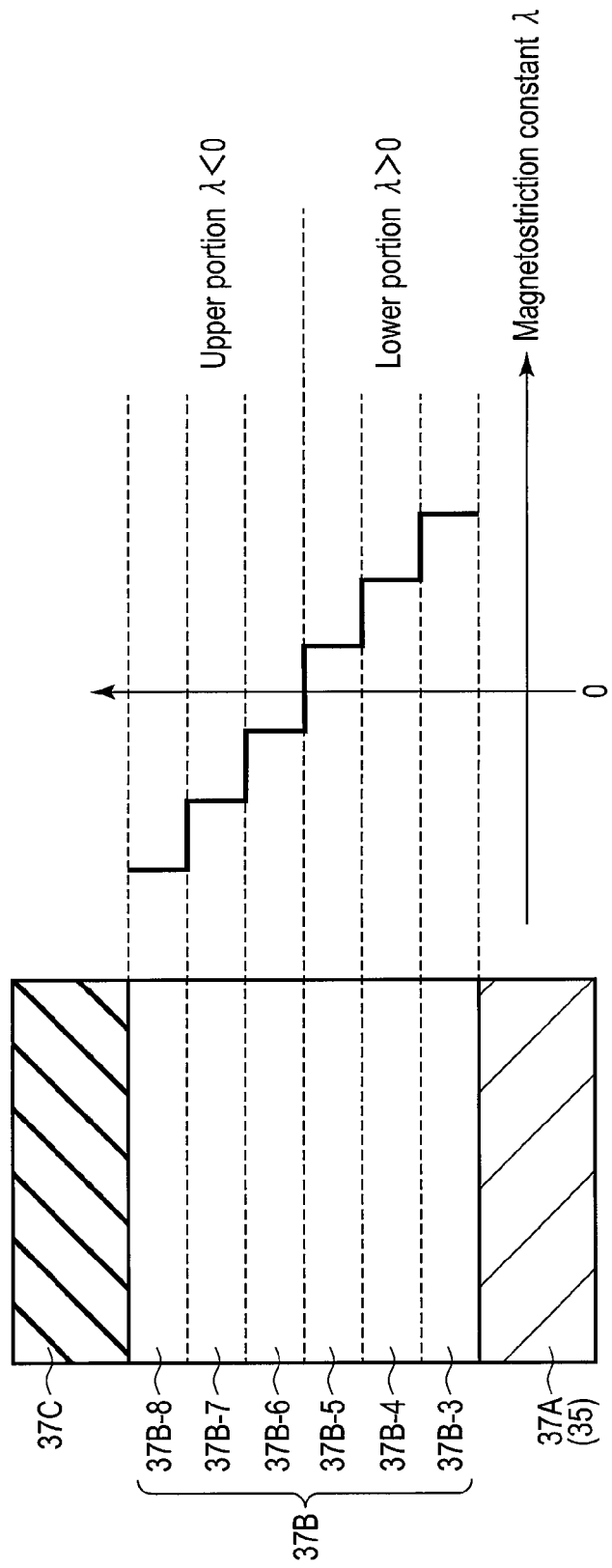
F I G. 14

US 9,231,195 B2

MAGNETIC MEMORY AND METHOD OF MANUFACTURING THE SAME

CROSS-REFERENCE TO RELATED APPLICATIONS

This application is based upon and claims the benefit of priority from Japanese Patent Application No. 2013-011225, filed Jan. 24, 2013, the entire contents of which are incorporated herein by reference.

FIELD

Embodiments described herein relate generally to a magnetic memory and a method of manufacturing the same.

BACKGROUND

Recently, a magnetic memory (MRAM: Magnetic Random Access Memory) is attracting attention as a nonvolatile memory that can be programmed an infinite number of times. The MRAM includes an MTJ (Magnetic Tunnel Junction) element using the tunnel magnetoresistive effect as a memory cell.

The MTJ element has a structure in which a plurality of ferromagnetic layers are stacked with a tunnel barrier layer being interposed between them. In the MTJ element, an electric current flows by tunneling through the tunnel barrier layer. In a data write operation, the magnetization directions in two ferromagnetic layers are relatively reversed into a parallel state or anti-parallel state by supplying a write current. In a read operation, the change in resistance value in the parallel state or anti-parallel state is detected by supplying a read current. More specifically, binary data is detected by a current value by regarding that the anti-parallel state in which the resistance value is maximum is a "1" state, and the parallel state in which the resistance value is minimum is a "0" state. In the MRAM, the time required for magnetization reversal is very short. Therefore, the access time of data read/write operation can be made shorter than that of a DRAM (Dynamic Random Access Memory).

The MRAM is expected as a nonvolatile large-capacity memory capable of high-speed read, and presumably used in a relatively severe environment such as a mobile memory of a mobile apparatus or a main memory of a personal computer.

Unfortunately, the MRAM has the problem that the read/write characteristics largely change (deteriorate) with respect to the temperature because data read/write is performed by controlling the magnetization directions in the ferromagnetic layers. Especially when the temperature decreases, the magnetization reversing energy of the ferromagnetic layer increases due to the magnetostriction effect. Consequently, the write characteristic at a low temperature is inferior to that at room temperature. This makes it necessary to study an MRAM having high reliability even when the temperature changes.

BRIEF DESCRIPTION OF THE DRAWINGS

FIG. 1 is a circuit diagram showing a memory cell array of an MRAM according to the first embodiment;
FIG. 4 is a sectional view taken along a line B-B' in FIG. 2;
FIG. 5 is a sectional view taken along a line C-C' in FIG. 2;
FIGS. 7A and 7B are views for explaining a write operation of the MTJ element according to the first embodiment;
FIG. 11A is a view showing magnetization in a memory layer at room temperature according to a comparative example;
FIG. 11B is a view showing magnetization in the memory layer at a low temperature according to the comparative example;
FIG. 12A is a view showing magnetization in the memory layer at room temperature according to the first embodiment;
FIG. 12B is a view showing magnetization in the memory layer at a low temperature according to the first embodiment;
FIG. 13 is a view showing the magnetization reversing energies of the memory layers at a low temperature according to the first embodiment and comparative example;
and
FIGS. 14 and 15 each include an enlarged sectional view of a memory layer according to the second embodiment and the magnetostriction constant of the memory layer.

DETAILED DESCRIPTION

Figure 2:
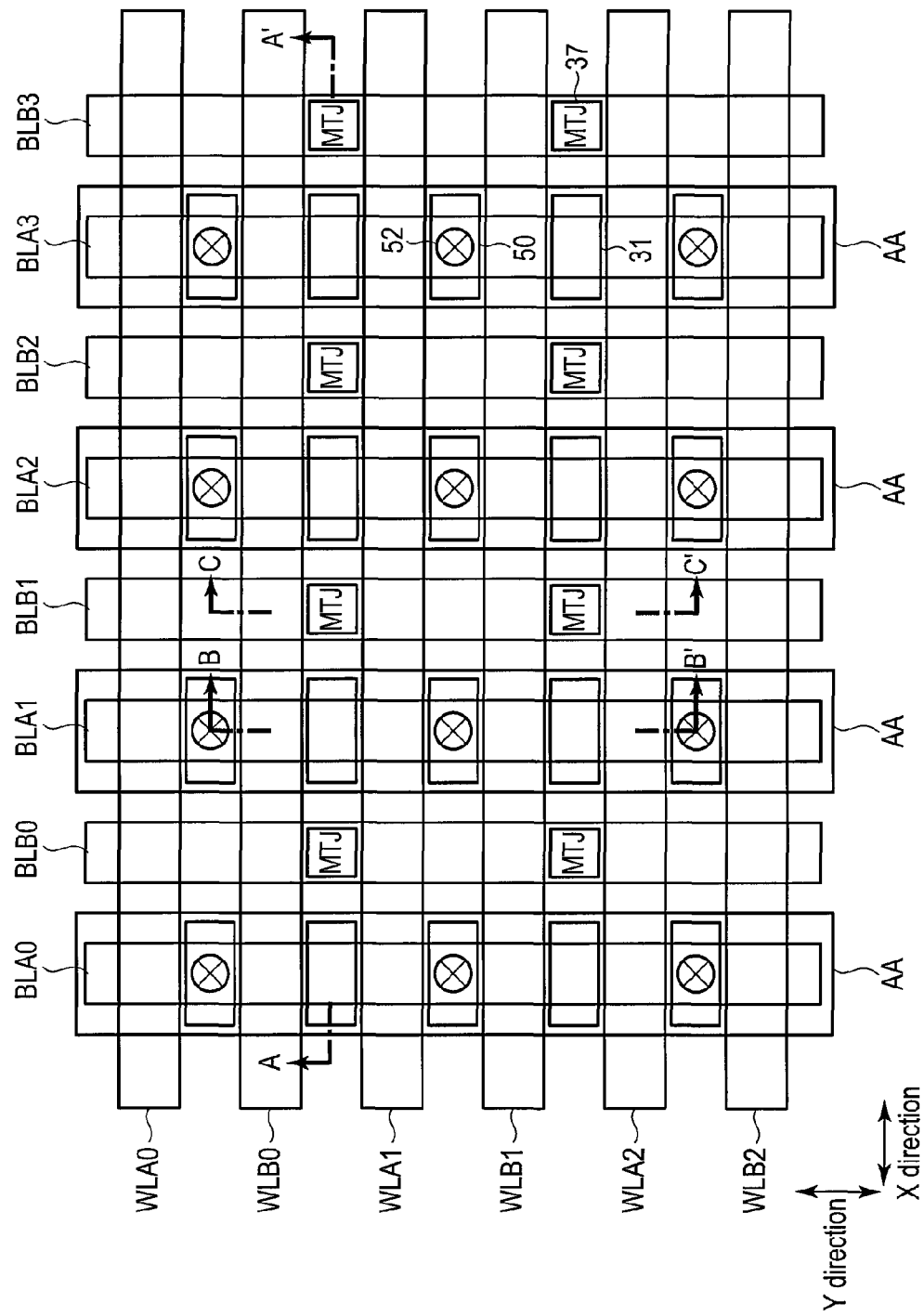
FIG. 2 is a plan view showing the memory cell array of the MRAM according to the first embodiment.

In general, according to one embodiment, a magnetic memory includes an electrode, a memory layer which is formed on the electrode and has magnetic anisotropy perpendicular to a film plane, and in which a magnetization direction is variable, a tunnel barrier layer formed on the memory layer, and a reference layer which is formed on the tunnel barrier layer and has magnetic anisotropy perpendicular to the film plane, and in which a magnetization direction is invariable. The memory layer has a positive magnetostriction constant on a side of the electrode, and a negative magnetostriction constant on a side of the tunnel barrier layer.

This embodiment will be explained below with reference to the accompanying drawing. In the drawing, the same reference numerals denote the same parts. Also, repetitive explanations will be made as needed.

First Embodiment

A magnetic memory (MRAM) according to the first embodiment will be explained with reference to FIGS. 1, 2, 3, 4, 5, 6, 7A, 7B, 8, 9, 10, 11A, 11B, 12A, 12B, and 13. In the first embodiment, a memory layer 37B has a multilayered structure including a first memory layer 37B-1 and second memory layer 37B-2. The magnetostriction constant of the first memory layer 37B-1 in the lower portion having a small volume change with respect to a temperature change is made positive, and that of the second memory layer 37B-2 in the upper portion having a large volume change is made negative. This makes it possible to suppress the increase in magnetization reversing energy at a low temperature, and suppress the deterioration of the write characteristic. The first embodiment will be explained in detail below.

[Structure of First Embodiment]

The structure of the MRAM according to the first embodiment will be explained below.

FIG. 1 is a circuit diagram showing a memory cell array of the MRAM according to the first embodiment.

As shown in FIG. 1, the memory cell array includes, as an example, a plurality of word lines WLA0 to WLA2 and WLB0 to WLB2 running in the X direction, and a plurality of bit lines BLA0 to BLA3 and BLB0 to BLB3 running in the Y direction perpendicular to the X direction. Note that in the following explanation, the word lines WLA0 to WLA2 and WLB0 to WLB2 will be referred to as word lines WLA and WLB when it is not particularly necessary to distinguish between them, and the bit lines BLA0 to BLA3 and BLB0 to BLB3 will be referred to as bit lines BLA and BLB when it is not particularly necessary to distinguish between them.

A memory cell MC includes an MTJ element 37 and two transistors 22-1 and 22-2. The current path of the MTJ element 37 has one end connected to the bit line BLB, and the other end connected to one terminal of each of the transistors 22-1 and 22-2. The other terminal of each of the transistors 22-1 and 22-2 is connected to the same bit line BLA. The control terminal of the transistor 22-1 is connected to the word line WLA, and the control terminal of the transistor 22-2 is connected to the word line WLB.

Figure 3:
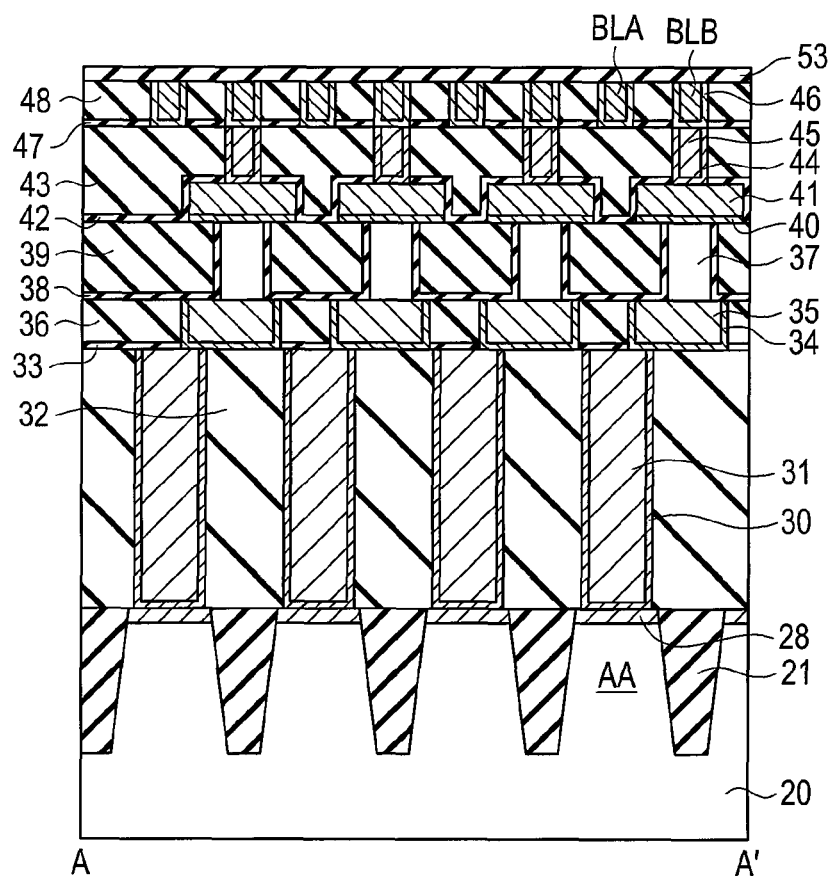
FIG. 3 is a sectional view taken along a line A-A' in FIG. 2.

FIG. 2 is a plan view showing the memory cell array of the MRAM according to the first embodiment. FIG. 3 is a sectional view taken along a line A-A' in FIG. 2. FIG. 4 is a sectional view taken along a line B-B' in FIG. 2, and is a sectional view of an element region (active area) AA. FIG. 5 is a sectional view taken along a line C-C' in FIG. 2, and is a sectional view of an element isolation region.

As shown in FIGS. 2, 3, 4, and 5, in the surface region of a p-type semiconductor substrate (e.g., a silicon substrate) 20, an element isolation insulating layer 21 extending in the Y direction is formed as the element isolation region. Of the surface region of the semiconductor substrate 20, a region where no element isolation insulating layer 21 is formed is the active area AA. The element isolation insulating layer 21 is formed by, e.g., STI (Shallow Trench Isolation). Silicon oxide ($SiO_2$) or the like is used as the element isolation insulating layer 21.

On the semiconductor substrate 20, the transistors 22-1 and 22-2 using, e.g., n-channel MOSFETs (Metal Oxide Semiconductor Field Effect Transistors) are formed. As the transistors 22-1 and 22-2, recess channel array transistors (RCATs) or the like are used. Note that the transistors 22-1 and 22-2 are not limited to the RCATs, and may also be planar MOSFETs or Fin-FETs. The RCAT has a structure in which a recess is formed in a semiconductor substrate and polysilicon as a gate is buried in this recess.

More specifically, a recess 23 extending in the X direction is formed in the semiconductor substrate 20. A gate insulating film 24 is formed in the recess 23. On the gate insulating film 24, a conductive polysilicon electrode 25A is so formed as to fill the recess 23. A metal gate electrode 25C is formed on the polysilicon electrode 25A with a conductive barrier film 25B being interposed between them. The polysilicon electrode 25A, barrier film 25B, and metal gate electrode 25C function as a gate electrode 25 of each of the transistors 22-1 and 22-2. The gate electrode 25 corresponds to the word line WL. The metal gate electrode 25C is made of, e.g., tungsten (W). The barrier film 25B is made of, e.g., tungsten nitride (WN). The upper surface and side surfaces of the gate electrode 25 are covered with a gate cap layer 26 made of, e.g., silicon nitride (SiN).

In the active area AA, a source region 27 and drain region 28 of each of the transistors 22-1 and 22-2 are formed on the two sides of the gate electrode 25. An n-type diffusion region is used as each of the source region 27 and drain region 28.

On the drain region 28, a cell contact 31 having a bottom surface and side surfaces covered with a barrier film 30 is formed. The cell contact 31 is made of, e.g., W. The barrier film 30 is made of, e.g., WN.

In the element region, an interlayer dielectric layer 32 made of, e.g., silicon oxide is formed between the barrier films 30. A protective film 33 made of, e.g., silicon nitride is formed on the interlayer dielectric layer 32 and gate cap layer 26.

In the active area AA, a lower electrode 35 having a bottom surface and side surfaces covered with a barrier film 34 is formed on the cell contact 31. In this example, the planar shape of the lower electrode 35 is, e.g., a T-shape. The lower electrode 35 extends from the element region to an adjacent active area AA on one side. The lower electrode 35 is made of, e.g., W or tantalum (Ta). The film thickness of the lower electrode 35 is, e.g., about 35 nm. The barrier film 34 is made of, e.g., titanium nitride (TiN). An interlayer dielectric layer 36 made of, e.g., $SiO_2$ is formed between the barrier films 34.

In the element region, the MTJ element 37 is formed on the lower electrode 35. The planar shape of the MTJ element 37 is not particularly limited. For example, the planar shape can be a square, circle, or ellipse. Details of the MTJ element 37 will be described later.

A protective film 38 made of, e.g., SiN is formed on the side surfaces of the MTJ element 37, and on the lower electrode 35 and interlayer dielectric layer 36. An interlayer dielectric layer 39 made of, e.g., $SiO_2$ is formed between the MTJ elements 37.

An upper electrode 41 having a bottom surface covered with a barrier film 40 is formed on the MTJ element 37. The upper electrode 41 is made of, e.g., W, Ta, or Ti. The barrier film 40 is made of, e.g., TiN. A protective film 42 made of, e.g., SiN is formed on the upper electrode 41 and interlayer dielectric layer 39. An interlayer dielectric layer 43 made of, e.g., $SiO_2$ is formed on the protective film 42.

In the interlayer dielectric layer 43, a bit line contact 45 having a bottom surface and side surfaces covered with a barrier film 44 is formed to reach the upper electrode 41. The bit line contact 45 is made of, e.g., tungsten. The barrier film 44 is made of, e.g., WN or Ti.

A protective film 47 made of, e.g., SiN is formed on the interlayer dielectric layer 43. An interlayer dielectric layer 48 made of, e.g., $SiO_2$ is formed on the protective film 47. In the interlayer dielectric layer 48, the bit line BLB having a bottom surface and side surfaces covered with a barrier film 46 is formed to reach the bit line contact 45. The bit line BLB is made of, e.g., Cu. The barrier film 46 is made of, e.g., TiN.

In the interlayer dielectric layer 32, a cell contact 50 having a bottom surface and side surfaces covered with a barrier film 49 is formed to reach the source region 27. The cell contact 50 is made of, e.g., W. The barrier film 49 is made of, e.g., WN.

A bit line contact 52 having a bottom surface and side surfaces covered with a barrier film 51 is formed on the cell contact 50. The bit line contact 52 is made of, e.g., W. The barrier film 51 is made of, e.g., WN.

The bit line BLA having a bottom surface and side surfaces covered with the barrier film 46 is formed on the bit line contact 52. The bit line BLA is formed by an interconnection layer on the same level as that of the bit line BLB. The bit line BLA is made of, e.g., Cu. A protective film 53 made of, e.g., SiN is formed on the pair of bit lines BLA and BLB and interlayer dielectric layer 48.

Next, the structure of the MTJ element 37 will be explained.

Figure 6:
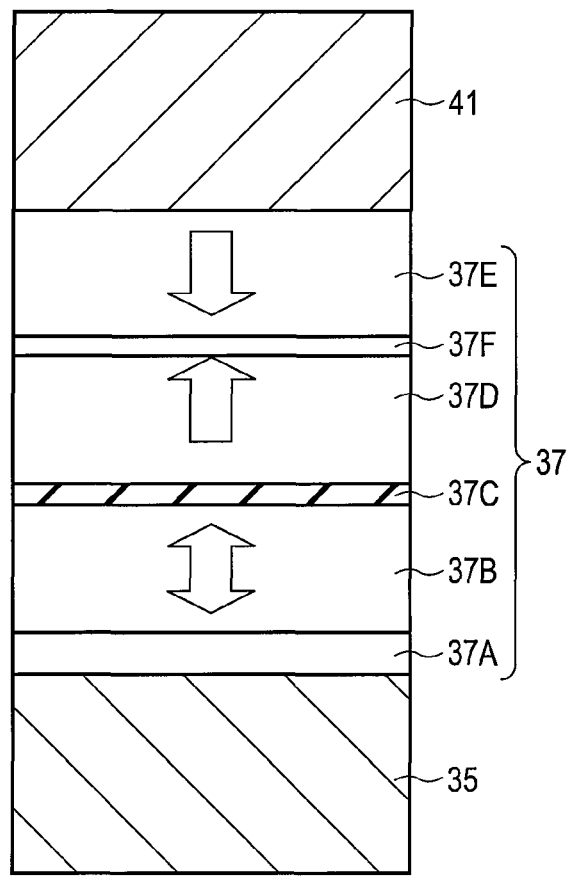
FIG. 6 is a sectional view showing an MTJ element according to the first embodiment.

FIG. 6 is a sectional view showing the MTJ element 37 according to the first embodiment.

As shown in FIG. 6, the MTJ element 37 includes an underlayer 37A formed between the lower electrode 35 and upper electrode 41, the memory layer (free layer) 37B, a tunnel barrier layer 37C, a reference layer (fixed layer) 37D, and a shift adjusting layer 37E.

The underlayer 37A is formed on the lower electrode 35. The underlayer 37A is made of, e.g., W. The thickness of the underlayer 37A is, e.g., about 5 nm. Note that the underlayer 37A need not always be formed, and may also be integrated with the under electrode 35.

The memory layer 37B is formed on the underlayer 37A. The memory layer 37B is a ferromagnetic layer in which the magnetization direction is variable, and has perpendicular magnetic anisotropy perpendicular to or almost perpendicular to the film plane (upper surface/lower surface). "The magnetization direction is variable" herein mentioned means that the magnetization direction changes with respect to a predetermined write current. Also, "almost perpendicular" means that the direction of the residual magnetization falls within the range of $45° < \theta \leq 90°$ with respect to the film plane.

The memory layer 37B is made of a ferromagnetic material containing, e.g., cobalt (Co) and iron (Fe). The memory layer 37B may also contain, e.g., nickel (Ni). Furthermore, boron (B) is added to the ferromagnetic material in order to adjust, e.g., the saturation magnetization or magnetocrystalline anisotropy. As will be described in detail later, the thermal expansion coefficient of the memory layer 37B is larger than those of the lower electrode 35 and underlayer 37A. The thickness of the memory layer 37B is, e.g., about 1 nm. The memory layer 37B will be explained in more detail later.

The tunnel barrier layer 37C is formed on the memory layer 37B. The tunnel barrier layer 37C is a nonmagnetic layer, and made of, e.g., magnesium oxide (MgO). The thickness of the tunnel barrier layer 37C is, e.g., about 0.9 nm.

The reference layer 37D is formed on the tunnel barrier layer 37C. The reference layer 37D is a ferromagnetic layer in which the magnetization direction is invariable, and has perpendicular magnetic anisotropy perpendicular to or almost perpendicular to the film plane. "The magnetization direction is invariable" herein mentioned means that the magnetization direction does not change with respect to a predetermined write current. That is, the magnetization-direction reversing energy barrier of the reference layer 37D is larger than that of the memory layer 37B.

The reference layer 37D is made of a ferromagnetic material containing, e.g., Co and Fe. The reference layer 37D may also contain Ni. Furthermore, B is added to the ferromagnetic material in order to adjust the saturation magnetization or magnetocrystalline anisotropy. The thickness of the reference layer 37D is, e.g., about 1.5 nm.

The shift adjusting layer 37E is formed on the reference layer 37D with a spacer layer 37F (e.g., an Ru (ruthenium) layer) being interposed between them. The shift adjusting layer 37E is a magnetic layer in which the magnetization direction is invariable, and has perpendicular magnetic anisotropy perpendicular to or almost perpendicular to the film plane. The magnetization direction in the shift adjusting layer 37E is opposite to that in the reference layer 37D. Accordingly, the shift adjusting layer 37E can cancel a leakage magnetic field applied from the reference layer 37D to the memory layer 37B. In other words, the shift adjusting layer 37E has an effect of adjusting the offset of the reversing characteristic, which is caused on the memory layer 37B by the leakage magnetic field from the reference layer 37D, in the opposite direction. The shift adjusting layer 37E is made of, e.g., an artificial lattice having a multilayered structure including a magnetic material such as Ni, Fe, or Co, and a nonmagnetic material such as Cu, Pd, or Pt. The upper electrode 41 is formed on the shift adjusting layer 37E.

The planar shape of the underlayer 37A, memory layer 37B, tunnel barrier layer 37C, reference layer 37D, and shift adjusting layer 37E is, e.g., a circle. Accordingly, the MTJ element 37 is formed into the shape of a pillar. However, the planar shape of the MTJ element 37 is not limited to this, and may also be, e.g., a square, rectangle, or ellipse.

Although not shown, an interface layer may also be formed in the interface between the reference layer 37D and tunnel barrier layer 37C. This interface layer achieves lattice matching with the tunnel barrier layer 37C in contact with the lower portion of the interface layer. For example, the interface layer is made of the same material as that of the reference layer 37D, but can have a different composition ratio.

Also, the memory layer 37B and reference layer 37D may have a dimensional difference in a plane. For example, the diameter of the reference layer 37D in a plane may also be smaller than that of the memory layer 37B. This can prevent an electrical shortcircuit between the memory layer 37B and reference layer 37D.

Furthermore, the positions of the memory layer 37B and reference layer 37D may also be switched. That is, the reference layer 37D, tunnel barrier layer 37C, and memory layer 37B may also be formed in this order on the lower electrode 35.

An operation example of the MTJ element 37 will now be explained.

The MTJ element 37 is, e.g., a spin-transfer torque magnetoresistive effect element. Therefore, when writing data in the MTJ element 37 or reading data from the MTJ element 37, electric currents are bidirectionally supplied to the MTJ element 37 in a direction perpendicular to the film plane.

More specifically, data is written in the MTJ element 37 as follows.

FIG. 7A is a view for explaining a write operation of the MTJ element 37 according to the first embodiment, and is a view showing the section of the MTJ element 37 in the parallel state. FIG. 7B is a view for explaining a write operation of the MTJ element 37 according to the first embodiment, and is a view showing the section of the MTJ element 37 in the anti-parallel state.

When an electric current flows from the lower electrode 35 to the upper electrode 41, i.e., when electrons are supplied from the upper electrode 41 (when electrons move from the reference layer 37D to the memory layer 37B), electrons spin-polarized in the same direction as the magnetization direction in the reference layer 37D are injected into the memory layer 37B. In this case, the magnetization direction of the memory layer 37B is matched with the magnetization direction in the reference layer 37D. Consequently, the magnetization directions in the reference layer 37D and memory layer 37B are arranged parallel to each other. In this parallel state, the resistance value of the MTJ element 37 is minimum. This state is defined as, e.g., data "0".

On the other hand, when an electric current flows from the upper electrode 41 to the lower electrode 35, i.e., when electrons are supplied from the lower electrode 35 (when electrons move from the memory layer 37B to the reference layer 37D), electrons reflected by the reference layer 37D and spin-polarized in the opposite direction to the magnetization direction in the reference layer 37D are injected into the memory layer 37B. In this case, the magnetization direction of the memory layer 37B is matched with the opposite direction to the magnetization direction in the reference layer 37D. Consequently, the magnetization directions in the reference layer 37D and memory layer 37B are arranged anti-parallel to each other. In this anti-parallel state, the resistance value of the MTJ element 37 is maximum. This state is defined as, e.g., data "1".

Also, data is read from the MTJ element 37 as follows.

A read current is supplied to the MTJ element 37. This read current is set at a value at which the magnetization direction in the memory layer 37B does not reverse (i.e., a value smaller than that of the write current). Data "0" or "1" described above can be read by detecting the change in resistance value of the MTJ element 37 in this state.

The memory layer 37B according to the first embodiment will be explained below.

Figure 8:
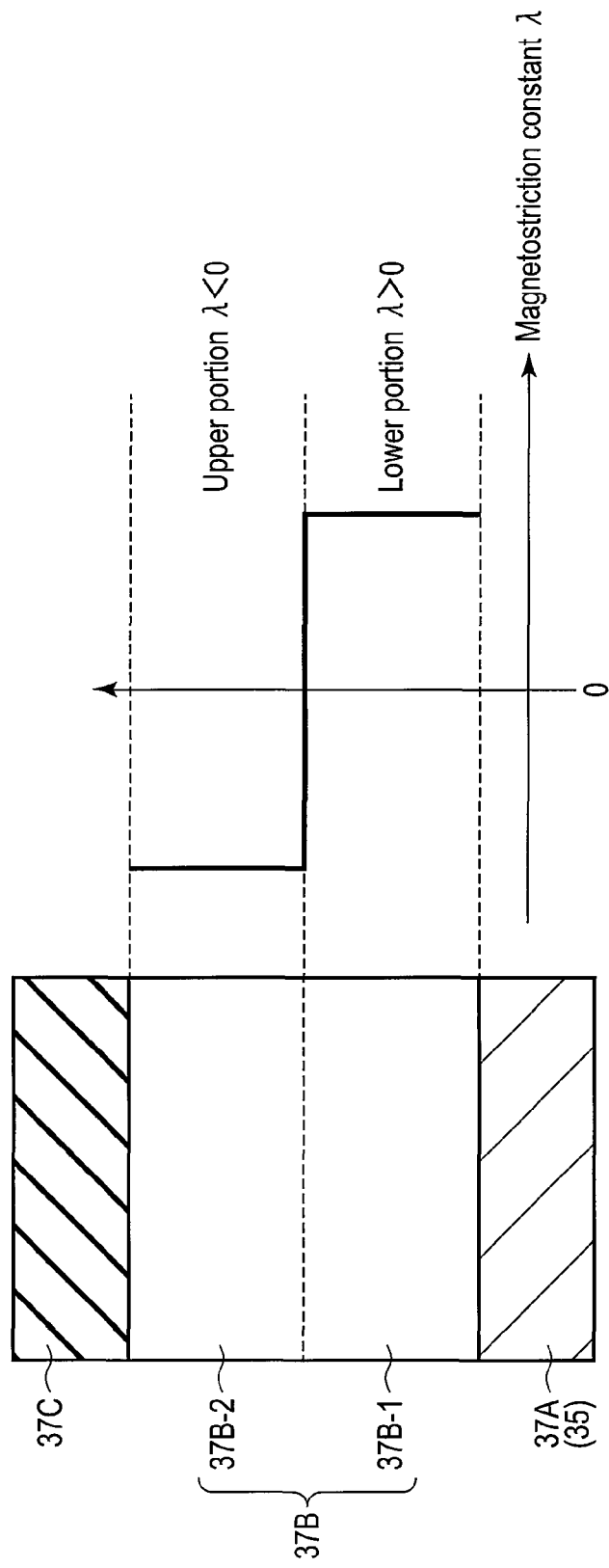
FIG. 8 includes an enlarged sectional view of a memory layer according to the first embodiment, and a graph showing the magnetostriction constant of the memory layer.
Figures 9, 10:
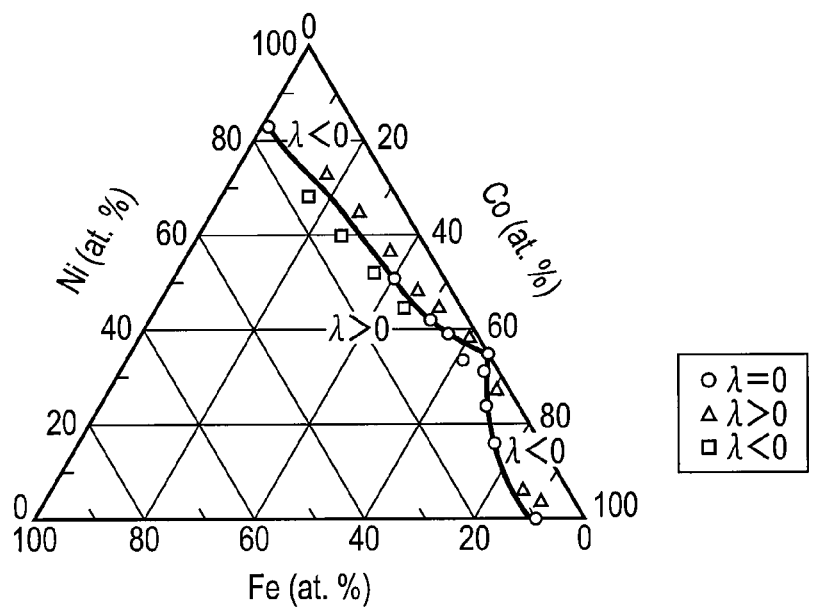
FIG. 9 is a view showing a magnetostriction constant with respect to the material composition of the memory layer according to the first embodiment.
FIG. 10 is a view showing the thermal expansion coefficients of materials according to the first embodiment.

FIG. 8 includes an enlarged sectional view of the memory layer 37B according to the first embodiment, and is a graph showing the magnetostriction constant of the memory layer 37B. FIG. 9 is a view showing a magnetostriction constant with respect to the material composition ratio of the memory layer 37B according to the first embodiment.

As shown in FIG. 8, the memory layer 37B of the first embodiment is a stack obtained by forming the first memory layer 37B-1 and second memory layer 37B-2 in this order.

The first memory layer 37B-1 is positioned in the lower portion of the memory layer 37B, and formed on the underlayer 37A (or lower electrode 35). Therefore, the first memory layer 37B-1 is formed in contact with the underlayer 37A (or lower electrode 35).

The first memory layer 37B-1 has a positive magnetostriction constant (magnetostriction constant $\lambda > 0$). Accordingly, when the volume of the first memory layer 37B-1 shrinks because the temperature decreases, the first memory layer 37B-1 is readily magnetized in a direction perpendicular to the shrinking direction.

The first memory layer 37B-1 contains a large amount of a ferromagnetic material having a positive magnetostriction constant in order to make the magnetostriction constant positive. An example of this ferromagnetic material having a positive magnetostriction constant is Fe. More specifically, as shown in FIG. 9, when the first memory layer 37B-1 mainly contains a Co—Fe alloy, the Fe concentration in this alloy is set at 10 at. % (atoms %) or more.

Note that in order to obtain a sufficiently high magnetization reversing energy, it is desirable to set the composition ratio of Co to Fe at 1:1, i.e., set the Co concentration and Fe concentration at 50 at. % in the first memory layer 37B-1. Also, when the first memory layer 37B-1 mainly contains a Co—Fe—Ni alloy, the Fe concentration in the alloy is set at 20 at. % or more, and preferably, 50 at. %.

The second memory layer 37B-2 is positioned in the upper portion of the memory layer 37B, and formed on the first memory layer 37B-1. Therefore, the second memory layer 37B-2 is formed in contact with the tunnel barrier layer 37C.

The second memory layer 37B-2 has a negative magnetostriction constant (magnetostriction constant $\lambda < 0$). Accordingly, when the volume of the second memory layer 37B-2 shrinks because the temperature decreases, the second memory layer 37B-2 is readily magnetized in the shrinking direction.

The second memory layer 37B-2 contains a large amount of a ferromagnetic material having a negative magnetostriction constant. Examples of this ferromagnetic material having a negative magnetostriction constant are Co and Ni. More specifically, as shown in FIG. 9, when the second memory layer 37B-2 mainly contains a Co—Fe alloy, the Co concentration in this alloy is set at 90 at. % or more in order to make the magnetostriction constant of the second memory layer 37B-2 negative. When the second memory layer 37B-2 mainly contains a Co—Fe—Ni alloy and the composition ratio of Co to Fe in the alloy is 1:1, the Ni concentration in the alloy is set at 70 at. % or more in order to make the magnetostriction constant of the second memory layer 37B-2 negative.

Thus, the positive and negative of the magnetostriction constant of each of the second memory layer 37B-2 and first memory layer 37B-1 are adjusted by changing the composition or composition ratio.

Note that the magnetostriction constant changes stepwise (discontinuously) (in the interface) between the first memory layer 37B-1 and second memory layer 37B-2 in FIG. 8, but the present invention is not limited to this. The magnetostriction constant may also start moderately changing near the interface between the first memory layer 37B-1 and second memory layer 37B-2, and change stepwise in the interface.

Note also that the first memory layer 37B-1 need only include a layer having a positive magnetostriction constant in at least a portion, and may also include a layer having a negative magnetostriction constant or a layer having a zero magnetostriction constant. Likewise, the second memory layer 37B-2 need only include a layer having a negative magnetostriction constant in at least a portion, and may also include a layer having a positive magnetostriction constant or a layer having a zero magnetostriction constant.

The thickness of the second memory layer 37B-2 is desirably 0.5 nm or less, and that of the first memory layer 37B-1 is desirably 0.5 nm or more. The thickness of the second memory layer 37B-2 is half that of the memory layer 37B or less. This is so because a minimal magnetization reversing energy is taken into account. That is, the magnetization reversing energy becomes too low if the thickness of the second memory layer 37B-2 is larger than 0.5 nm and that of the first memory layer 37B-1 is smaller than 0.5 nm. The thickness of the second memory layer 37B-2 need only be one atomic layer, i.e., about 0.2 nm or more.

Note that the thicknesses of the first memory layer 37B-1 and second memory layer 37B-2 are not limited to those described above. Thicknesses need only be combined so that the magnetization direction in the memory layer 37B is maintained in the perpendicular direction. In other words, the integration of the anisotropic constant (the magnetic anisotropic energy per unit volume) of the first memory layer 37B-1 and that of the second memory layer 37B-2 need only be positive.

Note also that the second memory layer 37B-2 need not be made of Co and Fe, or Co, Fe, and Ni, and need only be made of a ferromagnetic material having a negative magnetostriction constant. That is, the second memory layer 37B-2 may also contain a Co or Ni alloy.

FIG. 10 is a view showing the thermal expansion coefficients of the materials according to the first embodiment.

As shown in FIG. 10, the thermal expansion coefficients of the materials (Co, Fe, and Ni) forming the memory layer 37B (the first memory layer 37B-1 and second memory layer 37B-2) are larger than those of the materials (W and Ta) forming the underlayer 37A (and lower electrode 35).

In the first embodiment as described above, the memory layer 37B has a thermal expansion coefficient larger than that of the underlayer 37A (or lower electrode 35) in contact with the memory layer 37B, and is formed by the stack including the first memory layer 37B-1 having a positive magnetostriction constant and the second memory layer 37B-2 having a negative magnetostriction constant.

Next, the magnetostriction effect of the memory layer 37B according to the first embodiment will be explained.

FIG. 11A is a view showing magnetization in the memory layer 37B at room temperature according to a comparative example. FIG. 11B is a view showing magnetization in the memory layer 37B at a low temperature according to the comparative example. FIGS. 11A and 11B illustrate an example in which the memory layer 37B is magnetized upward in the direction perpendicular to the film plane (the parallel state shown in FIG. 7A).

The memory layer 37B according to the comparative example has a thermal expansion coefficient larger than that of the underlayer 37A (and lower electrode 35) in contact with the memory layer 37B, and is formed by a single-layered structure having a positive magnetostriction constant.

As shown in FIGS. 11A and 11B, the memory layer 37B according to the comparative example shrinks when the temperature is changed from room temperature to a low temperature. In other words, the volume of the memory layer 37B reduces. The memory layer 37B particularly shrinks in the direction parallel to the film plane. This is so because the diameter of the memory layer 37B is much larger than its thickness. A magnetostriction effect occurs when the memory layer 37B thus shrinks in the direction parallel to the film plane. Consequently, the memory layer 37B having a positive magnetostriction constant is readily magnetized in the direction perpendicular to the film plane. At a low temperature, therefore, the magnetization reversing energy increases, and the write characteristic becomes inferior to that at room temperature.

The thermal expansion coefficient of the underlayer 37A (and lower electrode 35) is smaller than that of the memory layer 37B. Accordingly, the shrinkage of the underlayer 37A (and lower electrode 35) is smaller than that of the memory layer 37B. Since the memory layer 37B is in contact with the underlayer 37A (and lower electrode 35), therefore, a stress occurs in the memory layer 37B in the direction parallel to the film plane. More specifically, when the memory layer 37B shrinks in the direction parallel to the film plane, a stress occurs in a direction to prevent the shrinkage (i.e., outward).

In this state, a stress applied to the lower portion of the memory layer 37B, which is closer to the underlayer 37A (and lower electrode 35), is larger than that applied to the upper portion of the memory layer 37B, which is farther from the underlayer 37A (and lower electrode 35). This makes the shrinkage of the lower portion of the memory layer 37B smaller than that of the upper portion. Consequently, the memory layer 37B deforms into a tapered shape that decreases the diameter from the lower portion to the upper portion. In the memory layer 37B, therefore, magnetization in the direction perpendicular to the film plane is larger in the upper portion having a large volume change amount than in the lower portion having a small volume change amount. That is, the upper portion of the memory layer 37B contributes to the increase in magnetization reversing energy more than the lower portion.

Note that the thermal expansion coefficient of the tunnel barrier layer 37C is smaller than that of the memory layer 37B. Since the thickness of the tunnel barrier layer 37C is relatively small, however, a stress applied to the memory layer 37B by the tunnel barrier layer 37C is almost negligible. More specifically, the thickness of the tunnel barrier layer 37C is, e.g., about 0.9 nm.

FIG. 12A is a view showing magnetization in the memory layer 37B at room temperature according to the first embodiment. FIG. 12B is a view showing magnetization in the memory layer 37B at a low temperature according to the first embodiment. FIGS. 12A and 12B illustrate an example in which the memory layer 37B is magnetized upward in the direction perpendicular to the film plane as in the comparative example.

The memory layer 37B according to the first embodiment has a thermal expansion coefficient larger than that of the underlayer 37A (and lower electrode 35) in contact with the memory layer 37B, and is formed by the stack including the first memory layer 37B-1 having a positive magnetostriction constant and the second memory layer 37B-2 having a negative magnetostriction constant.

As shown in FIGS. 12A and 12B, the memory layer 37B (the first memory layer 37B-1 and second memory layer 37B-2) according to the first embodiment shrinks when the temperature is changed from room temperature to a low temperature. In other words, the volume of the memory layer 37B reduces. The memory layer 37B particularly shrinks in the direction parallel to the film plane. This is so because the diameter of the memory layer 37B is much larger than its thickness.

Since the memory layer 37B thus shrinks in the direction parallel to the film plane, the first memory layer 37B-1 having a positive magnetostriction constant is readily magnetized in the direction perpendicular to the film plane due to the magnetostriction effect. On the other hand, since the memory layer 37B shrinks in the direction parallel to the film plane, the second memory layer 37B-2 having a negative magnetostriction constant is readily magnetized in the direction parallel to the film plane due to the magnetostriction effect.

That is, the first memory layer 37B-1 in the lower portion increases the magnetization reversing energy as in the comparative example, but the second memory layer 37B-2 in the upper portion decreases the magnetization reversing energy. This makes it possible to suppress the increase in magnetization reversing energy of the memory layer 37B as a whole. The first embodiment particularly suppresses the increase in magnetization reversing energy of the second memory layer 37B-2 in the upper portion having a large volume change. This can make the above-mentioned effect (the suppression of the increase in magnetization reversing energy caused by a low temperature) more notable.

In the first embodiment as shown in FIG. 13, therefore, the magnetization reversing energy from the anti-parallel state to the parallel state at a low temperature can be decreased from energy E1 to energy E1', when compared to the comparative example. In addition, the magnetization reversing energy from the parallel state to the anti-parallel state at a low temperature can be decreased from energy E2 to energy E2', when compared to the comparative example. That is, it is possible to lower the energy barrier in data write, and increase the probability at which electrons pass over the energy.

Note that the magnetization reversing energy of the whole memory layer 37B at a low temperature can be adjusted by the thicknesses of the first memory layer 37B-1 and second memory layer 37B-2, and the magnetostriction constants of the first memory layer 37B-1 and second memory layer 37B-2. These thicknesses and magnetostriction constants can be determined by taking account of the write characteristic and data retention characteristic of the MRAM.

The MTJ element 37 may also have an inverted structure. More specifically, it is also possible to form the underlayer 37A, shift adjusting layer 37E, reference layer 37D, tunnel barrier layer 37C, and memory layer 37B in this order on the lower electrode 35. In this structure, the memory layer 37B includes the second memory layer 37B-2 having a negative magnetostriction constant in the lower portion (on the side of the tunnel barrier layer 37C), and the first memory layer 37B-1 having a positive magnetostriction constant in the upper portion (on the side of the upper electrode 41).

Furthermore, the underlayer 37A may also be made of a material having a thermal expansion coefficient larger than that of the memory layer 37B. The memory layer 37B deforms into a tapered shape at a low temperature under the influence of the thermal expansion coefficient of the lower electrode 35 in this case as well. This is so because the thickness of the underlayer 37A is much smaller than that of the lower electrode 35, i.e., the lower electrode 35 largely contributes to the stress to be applied to the memory layer 37B.

[Manufacturing Method of First Embodiment]

A method of manufacturing the MRAM according to the first embodiment will be explained below. In this embodiment, particularly the manufacturing steps of the MTJ element 37 will be explained.

First, as shown in FIG. 6, an underlayer 37A is formed on a lower electrode 35, and a memory layer 37B is formed on the underlayer 37A. Details of the formation method of the memory layer 37B will be described later.

Then, a tunnel barrier layer 37C is formed on the memory layer 37B. The tunnel barrier layer 37C is a nonmagnetic layer, and contains at least Mg and o (e.g., Mg oxide) as main components. The tunnel barrier layer 37C is formed by, e.g., forming an Mg layer by sputtering and oxidizing it after that.

Subsequently, a reference layer 37D is formed on the tunnel barrier layer 37C by, e.g., sputtering. The reference layer 37D is made of, e.g., a ferromagnetic material containing Co and Fe. The reference layer 37D may also contain Ni. B is further added to the ferromagnetic material in order to adjust, e.g., the saturation magnetization or magnetocrystalline anisotropy.

A shift adjusting layer 37E is formed on the reference layer 37D by, e.g., sputtering with a spacer layer (not shown) being interposed between them. The shift adjusting layer 37E is made of, e.g., an artificial lattice having a multilayered structure including a magnetic material such as Ni, Fe, or Co, and a nonmagnetic material such as Cu, Pd, or Pt.

A hard mask (not shown) is formed on the shift adjusting layer 37E, and patterned to have, e.g., a circular planar shape. The hard mask is made of a conductive metal material, e.g., TiN. The hard mask is not limited to this material, and may also be a film containing Ti, Ta, or W, or a multilayered film containing them. This obviates the need to remove the hard mask later, and makes it possible to use the hard mask as a contact portion for an upper electrode 41.

Then, the shift adjusting layer 37E, reference layer 37D, tunnel barrier layer 37C, and memory layer 37B are processed by physical etching such as IBE (Ion Beam Etching) using the hard mask as a mask.

Consequently, the reference layer 37D, tunnel barrier layer 37C, and memory layer 37B are patterned into a circular planar shape like the hard mask.

After that, an interlayer dielectric layer 39 made of $SiO_2$ or the like is formed on the entire surface by, e.g., CVD. As a consequence, the interlayer dielectric layer 39 is buried between adjacent MTJ elements 37. The interlayer dielectric layer 39 formed on the MTJ element 37 is planarized, and etched back after that. This exposes the upper surface of the MTJ element 37. An upper electrode 41 is formed on the exposed MTJ element 37, and electrically connected to it.

The formation method of the memory layer 37B will now be explained in detail below.

First, as shown in FIG. 8, a first memory layer 37B-1 is formed on the underlayer 37A. The first memory layer 37B-1 contains, e.g., a Co—Fe alloy. In the first memory layer 37B-1, the composition ratio of Co to Fe of the Co—Fe alloy is set at, e.g., 1:1, i.e., the Co concentration and Fe concentration are set at 50 at. %. Consequently, the magnetostriction constant of the first memory layer 37B-1 can be made positive.

Then, a second memory layer 37B-2 is formed on the first memory layer 37B-1. The second memory layer 37B-2 contains, e.g., a Co—Fe alloy. In the second memory layer 37B-2, the Co concentration in the Co—Fe alloy is set at, e.g., 90 at. % or more. Consequently, the magnetostriction constant of the second memory layer 37B-2 can be made negative.

Note that the first memory layer 37B-1 may also contain a Co—Fe—Ni alloy, and the Fe concentration in this alloy is set at 20 at. %, and preferably, 50 at. % in this case. Note also that the second memory layer 37B-2 may also contain a Co—Fe—Ni alloy, and the Ni concentration in the alloy is set at 70 at. % or more in this case if the composition ratio of Co to Fe in the alloy is 1:1. The second memory layer 37B-2 may also contain a Co or Ni alloy.

Examples of the method of changing the magnetostriction constant between the first memory layer 37B-1 and second memory layer 37B-2, i.e., the method of changing the composition or composition ratio of the materials as described above are as follows.

For example, after the first memory layer 37B-1 may be formed by sputtering, the second memory layer 37B-2 may be formed by sputtering using a different target. It is also possible to form the first memory layer 37B-1 by sputtering using a plurality of targets, and then form the second memory layer 37B-2 by changing the watt of each target. More specifically, the watt of a target whose concentration is to be raised is increased. Also, after the first memory layer 37B-1 is formed by any of various methods, the second memory layer 37B-2 may be formed by ion-implanting a material (Ni or Co) having a negative magnetostriction constant into a part of the upper portion of the first memory layer 37B-1. Furthermore, after the first memory layer 37B-1 is formed by any of various methods, the second memory layer 37B-2 made of one atomic layer of Ni or Co may be formed by any or various methods (e.g., ALD (Atomic Layer Deposition) or sputtering).

Thus, the MTJ element 37 according to the first embodiment is formed.

[Effects of First Embodiment]

In the above-mentioned first embodiment, the memory layer 37B has a thermal expansion coefficient larger than that of the underlayer 37A (or under electrode 35) in contact with the lower portion of the memory layer 37B, and is formed by the stack including the first memory layer 37B-1 in the lower portion and the second memory layer 37B-2 in the upper portion. The magnetostriction constant of the first memory layer 37B-1 that changes its volume little when the temperature changes is made positive, and that of the second memory layer 37B-2 that largely changes its volume when the temperature changes is made negative. This makes it possible to suppress the increase in magnetization reversing energy of the memory layer 37B as a whole by the magnetostriction effect at a low temperature. Accordingly, the deterioration of the write characteristic at a low temperature can be suppressed.

If the magnetostriction constant of not only the second memory layer 37B-2 but also the first memory layer 37B-1 is made negative, the magnetization reversing energy of the whole memory layer 37B (the second memory layer 37B-2 and first memory layer 37B-1) decreases at a low temperature. In this case, the write characteristic improves but the data retention characteristic deteriorates at a low temperature.

In the first embodiment, however, the magnetostriction constant of the first memory layer 37B-1 having a small volume change is made positive. Therefore, the magnetization reversing energy of the first memory layer 37B-1 increases at a low temperature. That is, it is possible to suppress the unnecessary increase in magnetization reversing energy while ensuring a minimal magnetization reversing energy at a low temperature.

Second Embodiment

A magnetic memory (MRAM) according to the second embodiment will be explained with reference to FIG. 14. In the above-mentioned first embodiment, the memory layer 37B is formed by the multilayered structure including the first memory layer 37B-1 and second memory layer 37B-2. By contrast, the second embodiment is an example in which a memory layer 37B is formed by a multilayered structure including a third memory layer 37B-3, fourth memory layer 37B-4, fifth memory layer 37B-5, sixth memory layer 37B-6, seventh memory layer 37B-7, and eighth memory layer 37B-8. The second embodiment will be explained in detail below. Note that in the second embodiment, an explanation of the same features as those of the above first embodiment will be omitted, and differences will mainly be explained.

[Structure of Second Embodiment]

FIG. 14 includes an enlarged sectional view of the memory layer 37B according to the second embodiment, and a graph showing the magnetostriction constant of the memory layer 37B.

As shown in FIG. 14, the memory layer 37B of the second embodiment is formed by the stack in which the third memory layer 37B-3, fourth memory layer 37B-4, fifth memory layer 37B-5, sixth memory layer 37B-6, seventh memory layer 37B-7, and eighth memory layer 37B-8 are formed in this order.

The third memory layer 37B-3, fourth memory layer 37B-4, and fifth memory layer 37B-5 are positioned in the lower portion of the memory layer 37B, and formed in this order on an underlayer 37A (or under electrode 35).

The third memory layer 37B-3, fourth memory layer 37B-4, and fifth memory layer 37B-5 each have a positive magnetostriction constant (magnetostriction constant $\lambda>0$). Therefore, when the third memory layer 37B-3, fourth memory layer 37B-4, and fifth memory layer 37B-5 shrink their volumes because the temperature decreases, they are readily magnetized in a direction perpendicular to the shrinking direction.

The magnetostriction constant of the fourth memory layer 37B-4 is smaller than that of the third memory layer 37B-3. Also, the magnetostriction constant of the fifth memory layer 37B-5 is smaller than that of the fourth memory layer 37B-4. That is, the magnetostriction constant decreases stepwise (discontinuously) and gradually from the lower portion to the upper portion. Accordingly, the Fe concentration decreases and the Co and/or Ni concentration increases toward the upper portion.

The sixth memory layer 37B-6, seventh memory layer 37B-7, and eighth memory layer 37B-8 are positioned in the upper portion of the memory layer 37B, and formed in this order on the fifth memory layer 37B-5.

The sixth memory layer 37B-6, seventh memory layer 37B-7, and eighth memory layer 37B-8 have a negative magnetostriction constant (magnetostriction constant $\lambda<0$). Therefore, when the sixth memory layer 37B-6, seventh memory layer 37B-7, and eighth memory layer 37B-8 shrink their volumes because the temperature decreases, they are readily magnetized in the shrinking direction.

The magnetostriction constant of the seventh memory layer 37B-7 is smaller than that of the sixth memory layer 37B-6. Also, the magnetostriction constant of the eighth memory layer 37B-8 is smaller than that of the seventh memory layer 37B-7. That is, the magnetostriction constant decreases stepwise and gradually from the lower portion to the upper portion. Accordingly, the Fe concentration decreases and the Co and/or Ni concentration increases toward the upper portion.

Note that the second embodiment is an example in which the memory layer 37B includes six layers, but the present invention is not limited to this example. Note also that the second embodiment is an example in which the lower portion having a positive magnetostriction constant includes three layers and the upper portion having a negative magnetostriction constant includes three layers, but the present invention is not limited to this example. Furthermore, the lower portion and upper portion may include different numbers of layers.

Also, the magnetostriction constant changes stepwise (discontinuously) (in the interfaces) between the third memory layer 37B-3, fourth memory layer 37B-4, fifth memory layer 37B-5, sixth memory layer 37B-6, seventh memory layer 37B-7, and eighth memory layer 37B-8 in FIG. 14, but the present invention is not limited to this. The magnetostriction constant may also start moderately changing near the interfaces between the third memory layer 37B-3, fourth memory layer 37B-4, fifth memory layer 37B-5, sixth memory layer 37B-6, seventh memory layer 37B-7, and eighth memory layer 37B-8, and then change stepwise in these interfaces.

[Effects of Second Embodiment]

The above-mentioned second embodiment can achieve the same effects as those of the first embodiment.

In addition, in the second embodiment, the memory layer 37B is formed by the multilayered structure including the third memory layer 37B-3, fourth memory layer 37B-4, fifth memory layer 37B-5, sixth memory layer 37B-6, seventh memory layer 37B-7, and eighth memory layer 37B-8, and the magnetostriction constant decreases stepwise and gradually toward the upper portion. On the other hand, the volume change (shrinkage) amount of the memory layer 37B at a low temperature gradually increases toward the upper portion. That is, the magnetostriction constant is gradually changed from positive to negative in accordance with the volume change amount from the lower portion to the upper portion.

More specifically, of the third memory layer 37B-3, fourth memory layer 37B-4, and fifth memory layer 37B-5 in the lower portion, the magnetostriction constant of the third memory layer 37B-3 having the smallest volume change is given a positive value having the largest absolute value, and that of the fifth memory layer 37B-5 having the largest volume change is given a positive value having the smallest absolute value. This makes it possible to more appropriately control the increase in magnetization reversing energy in the lower portion (the third memory layer 37B-3, fourth memory layer 37B-4, and fifth memory layer 37B-5) of the memory layer 37B at a low temperature.

On the other hand, of the sixth memory layer 37B-6, seventh memory layer 37B-7, and eighth memory layer 37B-8 in the upper portion, the magnetostriction constant of the sixth memory layer 37B-6 having the smallest volume change is given a negative value having the smallest absolute value, and that of the eighth memory layer 37B-8 having the largest volume change is given a negative value having the largest absolute value. This makes it possible to more appropriately control the decrease in magnetization reversing energy in the upper portion (the sixth memory layer 37B-6, seventh memory layer 37B-7, and eighth memory layer 37B-8) of the memory layer 37B at a low temperature.

Third Embodiment

A magnetic memory (MRAM) according to the third embodiment will be explained with reference to FIG. 15. The third embodiment is an example in which a memory layer 37B is formed by a gradation layer in which the magnetostriction constant continuously and gradually decreases from positive to negative from the lower portion to the upper portion. The third embodiment will be explained in detail below. Note that in the third embodiment, an explanation of the same features as those of the above-mentioned first embodiment will be omitted, and differences will mainly be explained.

[Structure of Third Embodiment]

Figure 15:
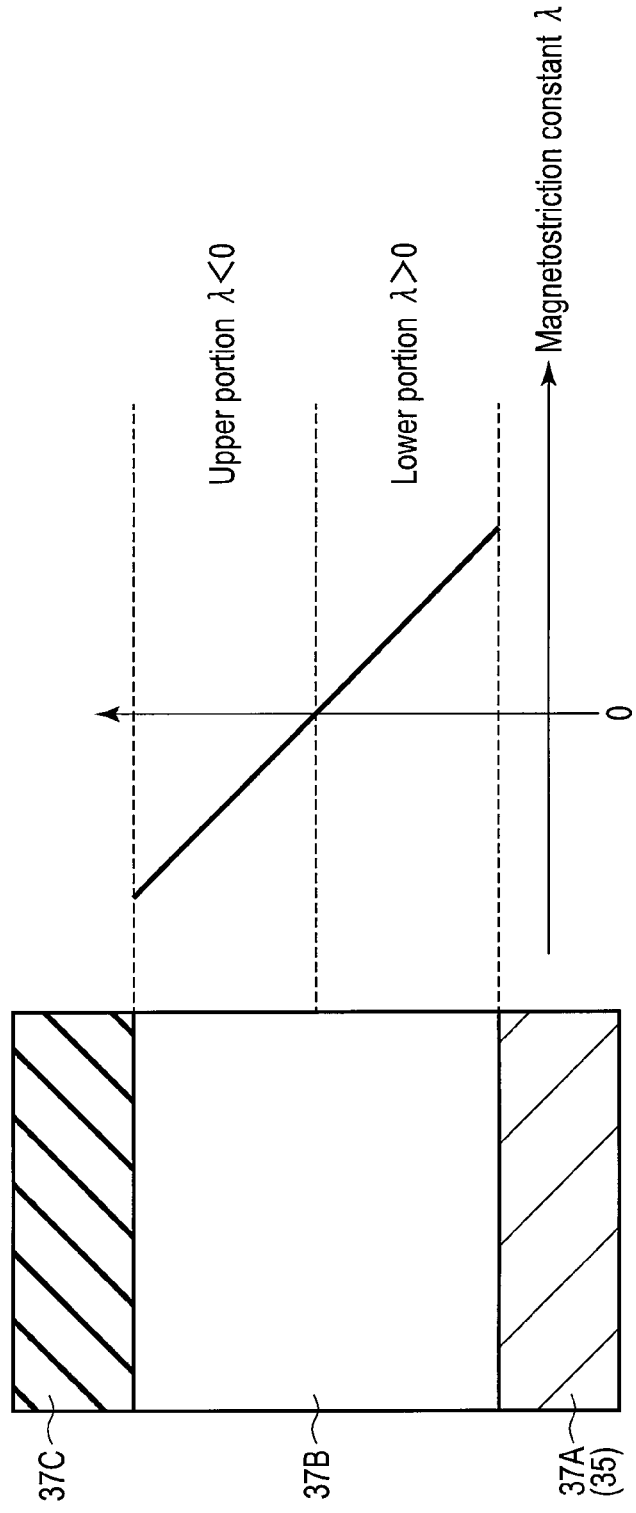

FIG. 15 includes an enlarged sectional view of the memory layer 37B according to the third embodiment, and a graph showing the magnetostriction constant of the memory layer 37B.

As shown in FIG. 15, the memory layer 37B of the third embodiment is formed by a gradation layer in which the magnetostriction constant gradually changes. That is, the memory layer 37B gradually changes its composition ratio.

The lower portion of the memory layer 37B has a positive magnetostriction constant (magnetostriction constant $\lambda > 0$). Therefore, when the volume of the lower portion of the memory layer 37B shrinks because the temperature decreases, the lower portion is readily magnetized in a direction perpendicular to the shrinking direction. On the other hand, the upper portion of the memory layer 37B has a negative magnetostriction constant (magnetostriction constant $\lambda < 0$). Therefore, when the volume of the upper portion of the memory layer 37B shrinks because the temperature decreases, the upper portion is readily magnetized in the direction perpendicular to the shrinking direction.

The magnetostriction constant of the memory layer 37B continuously and gradually decreases from positive to negative from the lower portion to the upper portion. In the memory layer 37B, therefore, the Fe concentration continuously and gradually decreases from the lower portion to the upper portion, and the Co and/or Ni concentration continuously and gradually increases from the lower portion to the upper portion.

Note that FIG. 15 shows an example in which the magnetostriction constant of the memory layer 37B linearly, continuously, and gradually changes, but the present invention is not limited to this example. That is, the magnetostriction constant of the memory layer 37B may also curvedly, continuously, and gradually change.

[Effects of Third Embodiment]

The above-mentioned third embodiment can achieve the same effects as those of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   an electrode;
   a memory layer which is formed on the electrode and has magnetic anisotropy perpendicular to a film plane, and in which a magnetization direction is variable;
   a tunnel barrier layer formed on the memory layer; and
   a reference layer which is formed on the tunnel barrier layer and has magnetic anisotropy perpendicular to the film plane, and in which a magnetization direction is invariable,
   wherein the memory layer has a positive magnetostriction constant on a side of the electrode, and a negative magnetostriction constant on a side of the tunnel barrier layer.

2. The memory of claim 1, wherein a thermal expansion coefficient of the memory layer is larger than that of the electrode.

3. The memory of claim 1, wherein a composition or composition ratio of the memory layer on the side of the electrode is different from that of the memory layer on the side of the tunnel barrier layer.

4. The memory of claim 1, wherein
   the memory layer comprises:
   a first memory layer formed on the side of the electrode and having a positive magnetostriction constant; and
   a second memory layer formed on the side of the tunnel barrier layer and having a negative magnetostriction constant, and
   a magnetostriction constant is discontinuous between the first memory layer and the second memory layer.

5. The memory of claim 4, wherein a thickness of the second memory layer is not more than 0.5 nm, and that of the first memory layer is not less than 0.5 nm.

6. The memory of claim 5, wherein the thickness of the second memory layer is not more than half that of the first memory layer.

7. The memory of claim 1, wherein the magnetostriction constant of the memory layer continuously decreased from the side of the electrode to the side of the tunnel barrier layer.

8. The memory of claim 1, wherein the memory layer contains a Co—Fe alloy on the side of the tunnel barrier layer, and a Co concentration in the Co—Fe alloy is not less than 90 at. %.

9. The memory of claim 1, wherein the memory layer contains a Co—Fe—Ni alloy on the side of the tunnel barrier layer, a composition ratio of Co to Fe in the Co—Fe—Ni alloy is 1:1, and an Ni concentration in the Co—Fe—Ni alloy is not less than 70 at. %.

10. The memory of claim 4, wherein
    the first memory layer comprises a third memory layer, a fourth memory layer, and a fifth memory layer formed in this order from the side of the electrode, and having magnetostriction constants decreasing in an order named; and
    the second memory layer comprises a sixth memory layer, a seventh memory layer, and an eighth memory layer formed in this order from the side of the tunnel barrier layer, and having negative magnetostriction constants increasing in an order named,
    wherein the magnetostriction constants are discontinuous between the third memory layer, the fourth memory layer, the fifth memory layer, the sixth memory layer, the seventh memory layer, and the eighth memory layer.

11. The memory of claim 1, wherein the memory contains a Co—Fe alloy on the side of the electrode, a composition ratio of Co to Fe in the Co—Fe alloy is 1:1.

12. The memory of claim 1, wherein the memory layer contains a Co—Fe—Ni alloy on the side of the tunnel barrier layer, and an Fe concentration in the Co—Fe—Ni alloy is not less than 20 at. %.

13. The memory of claim 1, wherein in the memory layer, the Fe concentration on the side of the electrode is higher than that on the side of the tunnel barrier layer.

14. A magnetic memory manufacturing method comprising:
- forming, on an electrode, a memory layer which has magnetic anisotropy perpendicular to a film plane, and in which a magnetization direction is variable;
- forming a tunnel barrier layer on the memory layer; and
- forming, on the tunnel barrier layer, a reference layer which has magnetic anisotropy perpendicular to the film plane, and in which a magnetization direction is invariable,
- wherein the forming the memory layer comprises:
- forming a first layer having a positive magnetostriction constant on the electrode; and
- forming a second layer having a negative magnetostriction constant on the first layer.

15. The method of claim 14, wherein the first layer and the second layer are formed by sputtering, and compositions or composition ratios of the first layer and the second layer are made different by changing targets between the forming the first layer and the forming the second layer.

16. The method of claim 14, wherein the first layer and the second layer are formed by sputtering using targets, and compositions or composition ratios of the first layer and the second layer are made different by changing a watt of each target between the forming the first layer and the forming the second layer.

17. The method of claim 14, wherein the forming the second layer comprises ion-implanting a material having a negative magnetostriction constant in a part of an upper portion of the first layer.

18. The method of claim 14, wherein the forming the second layer comprises forming one atomic layer including material having a negative magnetostriction constant on the first layer.

* * * * *